(12) United States Patent
Oldsen

(10) Patent No.: US 9,670,057 B1
(45) Date of Patent: Jun. 6, 2017

(54) SENSOR DEVICE AND METHOD FOR MAKING THEREOF

(71) Applicant: Infineon Technologies AG, Neubiberg (DE)

(72) Inventor: Marten Oldsen, Anzing (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/009,855

(22) Filed: Jan. 29, 2016

(51) Int. Cl.
| | |
|---|---|
| H01L 29/84 | (2006.01) |
| H01L 23/02 | (2006.01) |
| H01L 23/06 | (2006.01) |
| H01L 21/00 | (2006.01) |
| B81B 3/00 | (2006.01) |
| B81C 1/00 | (2006.01) |

(52) U.S. Cl.
CPC ........ *B81B 3/0072* (2013.01); *B81C 1/00309* (2013.01); *B81B 2201/0264* (2013.01); *B81B 2203/0127* (2013.01); *B81B 2207/09* (2013.01)

(58) Field of Classification Search
CPC ....... B81B 3/00; B81B 3/0018; B81B 3/0021; B81B 3/0035; B81B 3/0064; B81B 7/00; B81B 7/0016; B81B 7/0048; B81B 7/008; B81C 1/00158; B81C 1/00182; B81C 1/00222; B81C 1/0023; B81C 1/00261

USPC .... 438/48, 50, 52, 53, 63, 64, 66, 117, 127; 257/415, 417, 418, 678, 684
See application file for complete search history.

(56) References Cited

U.S. PATENT DOCUMENTS

| | | | |
|---|---|---|---|
| 8,946,831 B2 | 2/2015 | Liu et al. | |
| 9,013,013 B1* | 4/2015 | Beer | G01L 19/0069 257/415 |
| 9,233,834 B2* | 1/2016 | Faralli | B81B 3/0021 |
| 2012/0126346 A1 | 5/2012 | Hoechst et al. | |

OTHER PUBLICATIONS

"STM LPS25HB Teardown", 2015, 6 pages, ABI Research.
Uranga et al. CMOS-MEMS resonators: From devices to applications, Microelectronic Engineering 132, 2015, pp. 58-73.

* cited by examiner

*Primary Examiner* — Hsien Ming Lee
(74) *Attorney, Agent, or Firm* — Viering, Jentschura & Partner mbB

(57) ABSTRACT

A sensor device may include an electronic device that has at least one integrated circuit device and a MEMS sensor that are each monolithically integrated with a semiconductor substrate. The sensor device may include a suspension structure that suspends the MEMS sensor over a back cavity within the semiconductor substrate. The suspension structure may be springs or a spring structure formed from etching the front side of the substrate.

17 Claims, 14 Drawing Sheets

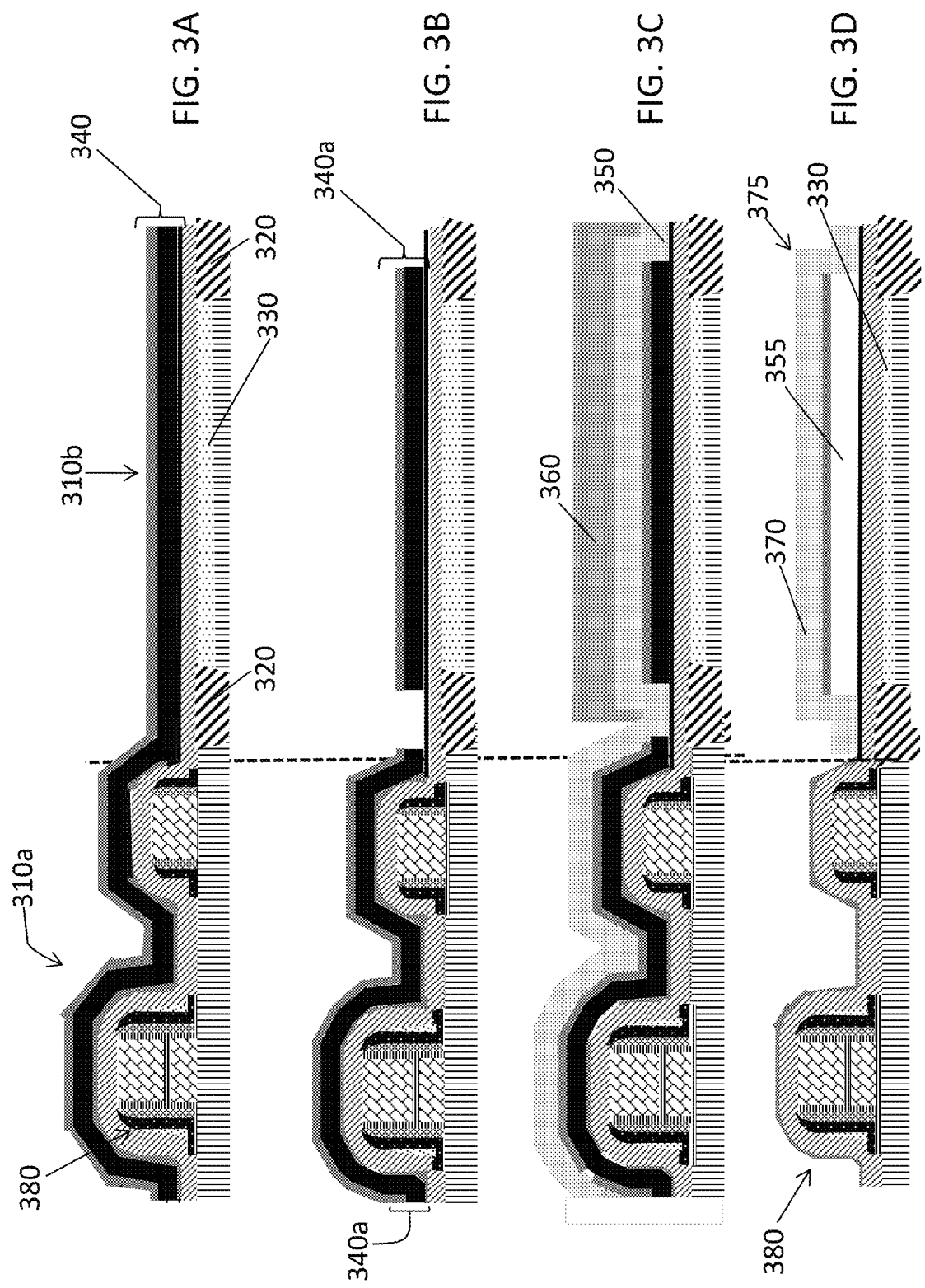

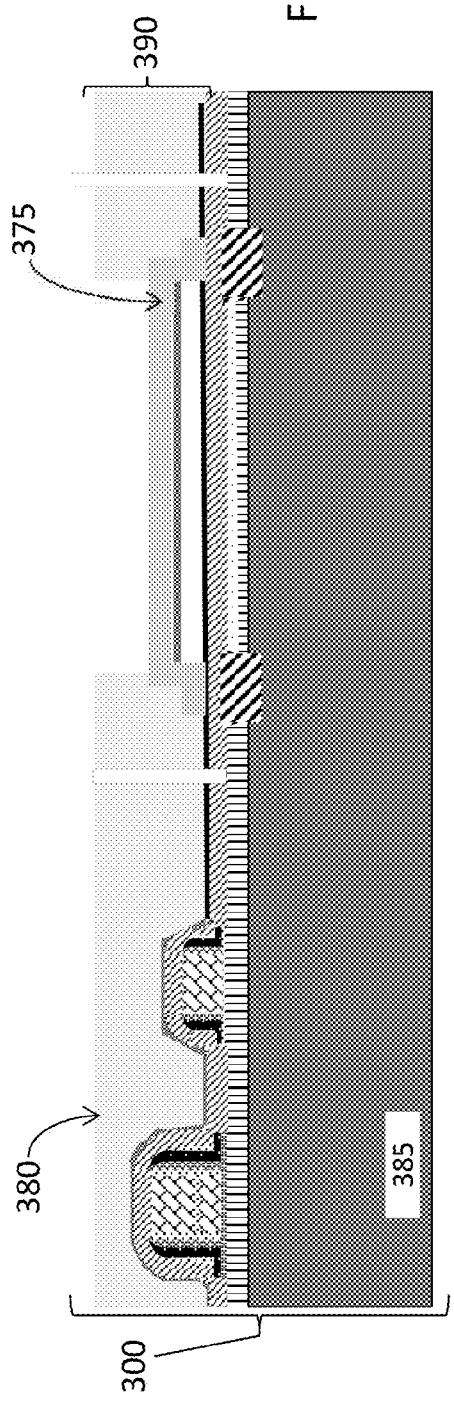
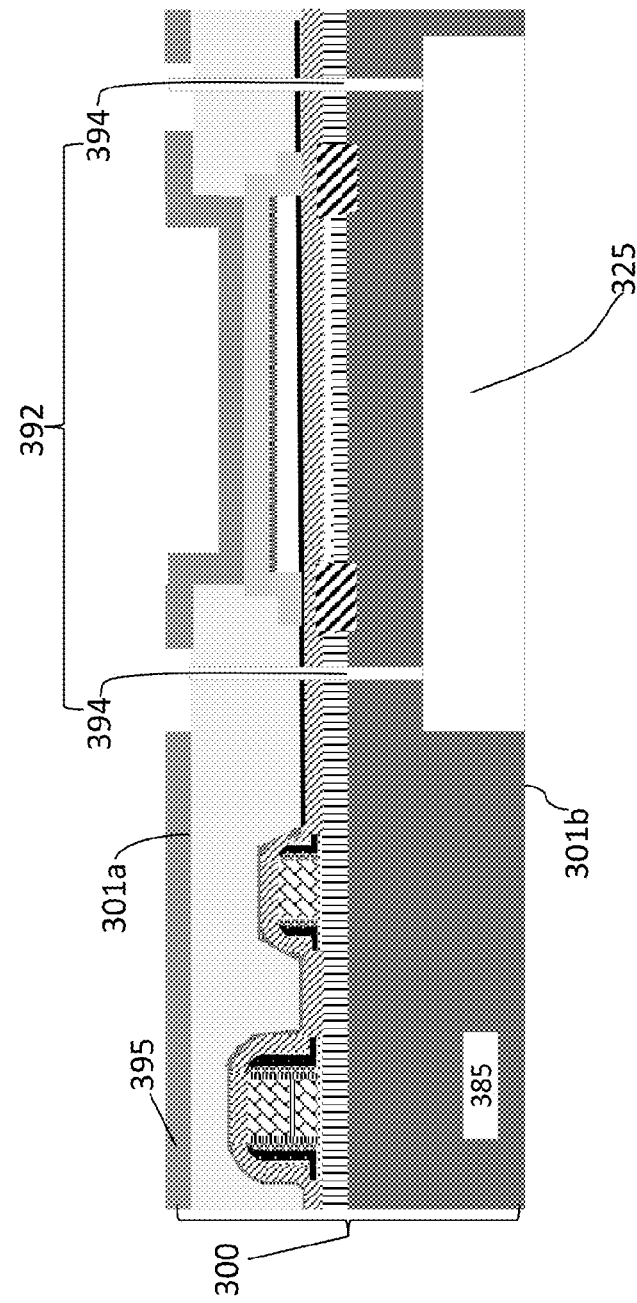

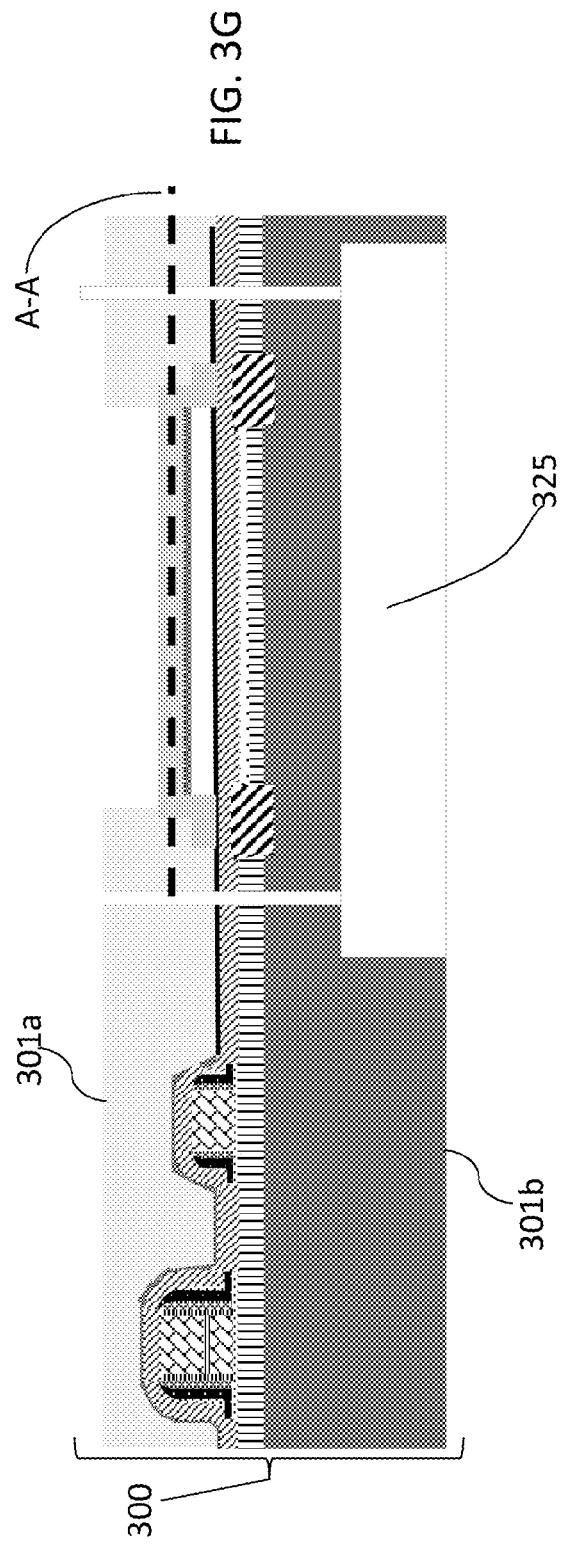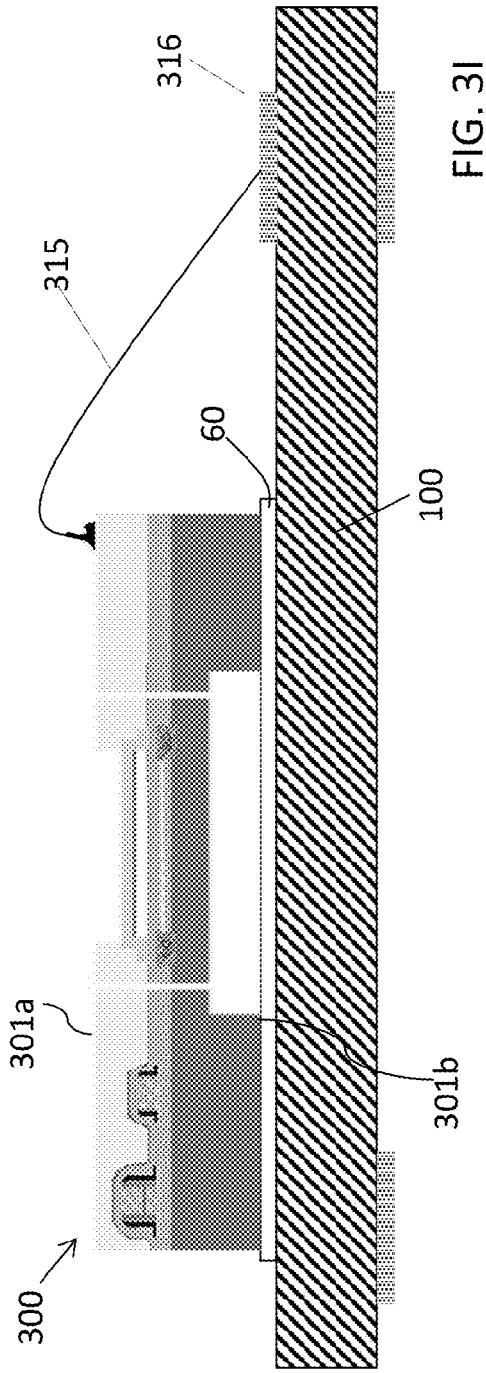

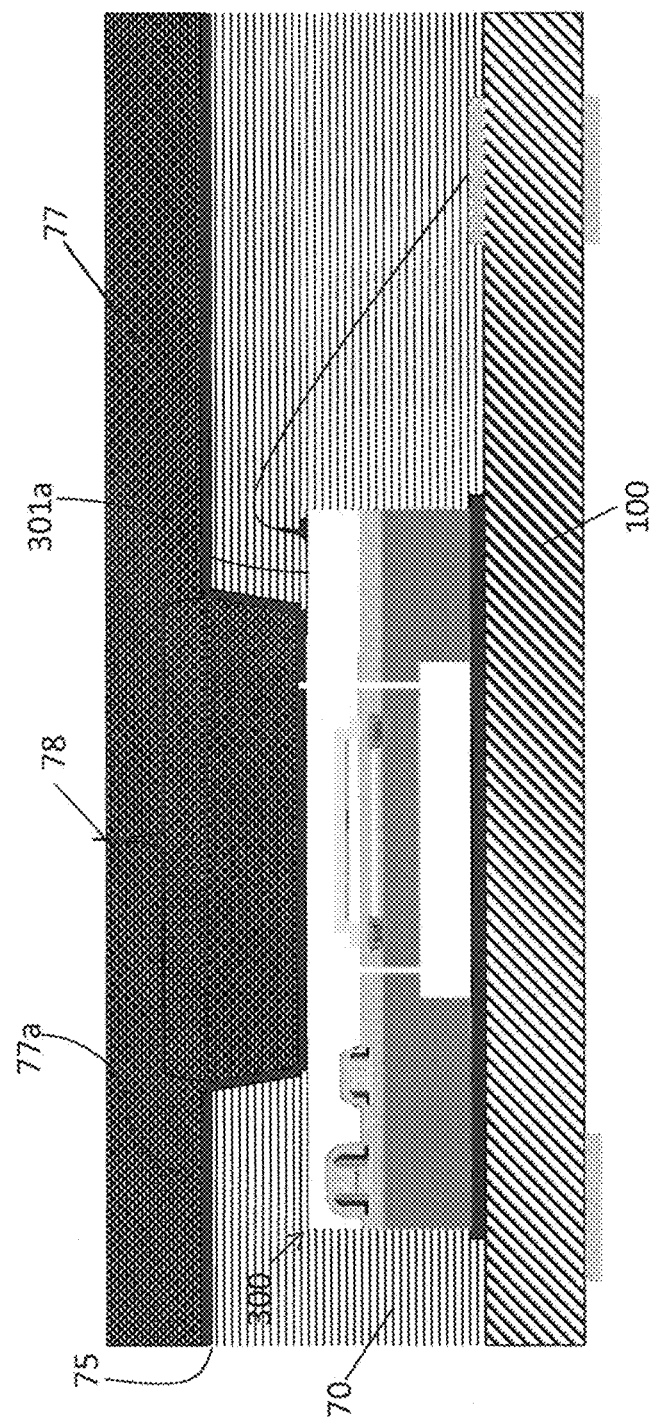

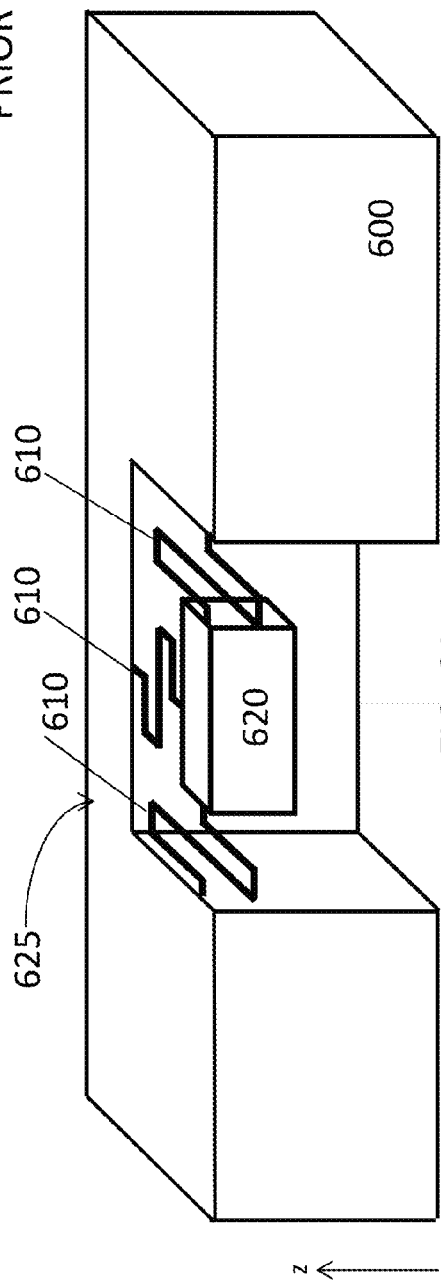
FIG. 6A PRIOR ART
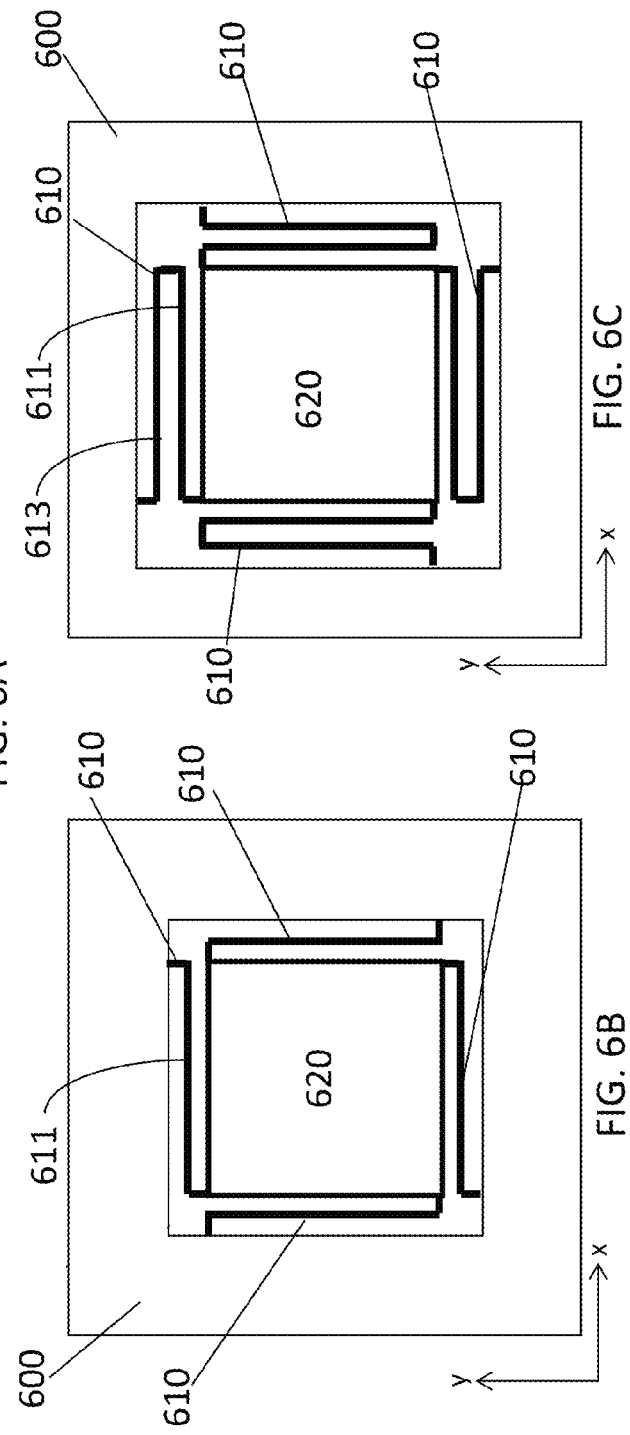
FIG. 6B
FIG. 6C

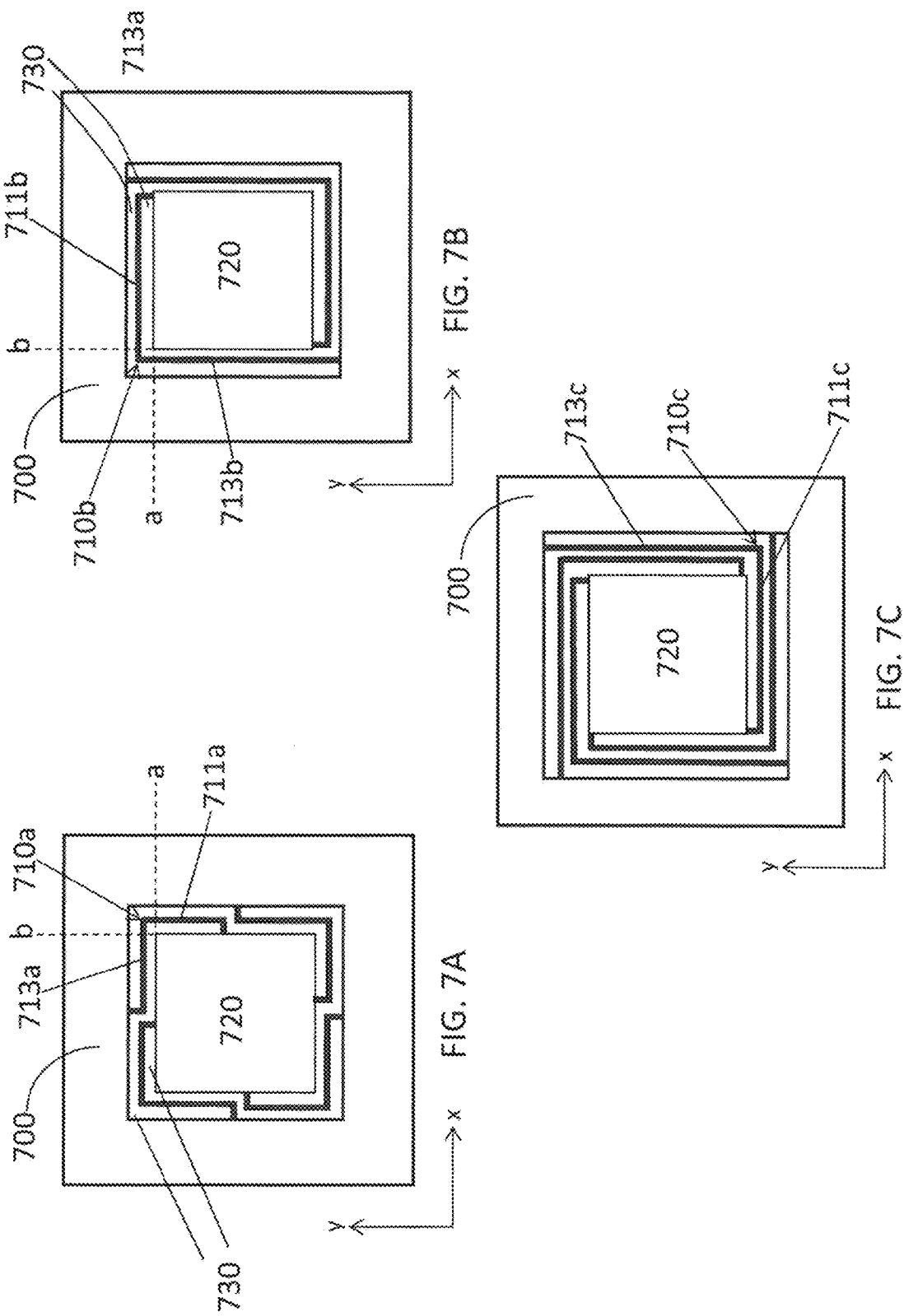

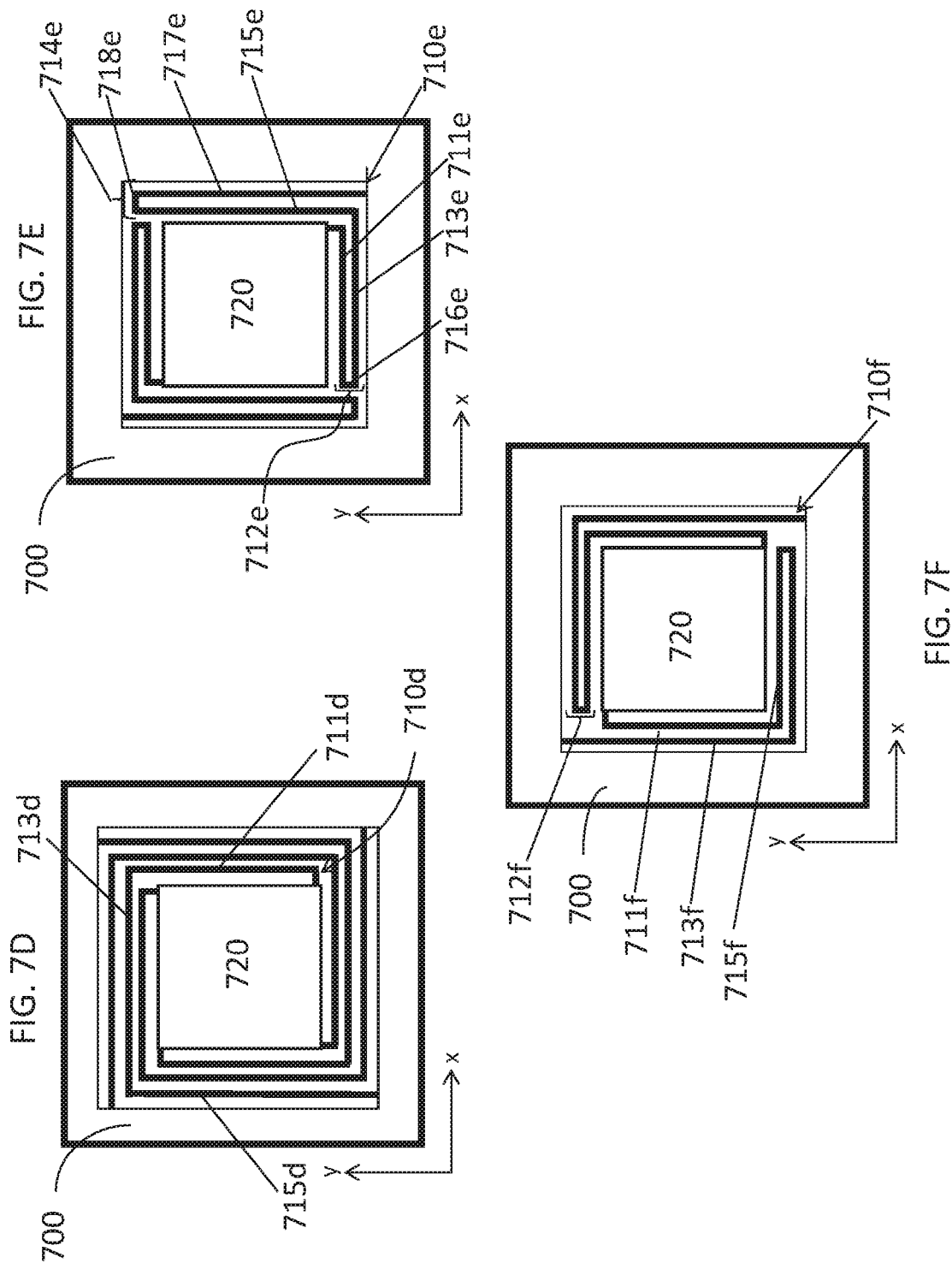

SENSOR DEVICE AND METHOD FOR MAKING THEREOF

TECHNICAL FIELD

Various embodiments relate generally to sensor devices and methods for manufacturing sensor devices.

BACKGROUND

Electronic devices may include micro-electro-mechanical systems (MEMS) are used in a variety of devices and applications. MEMS may include, for example, a pressure sensor. The consumer pressure sensor market is becoming mainly ASP driven. The main expense factor for today's pressure sensor modules is the quasi-standard open cavity LGA package which can represent 60% of the manufacturing costs. Generally it may be desired to use a low cost molded package in order to reduce manufacturing costs. Some MEMS, such as pressures sensors, are very sensitive to mechanical stress. Thick silicone glue inside a package may be used to decouple mechanical stress from a MEMS stress is from the MEMS by thick silicone glue inside the package. However, stress decoupling on package level with silicone glue is not possible in standard molded packages. Additionally, the mold compound can exert stress which depends on environmental factors such as humidity and temperature. As a consequence, it is not possible to use molded pressure sensor packages.

SUMMARY

In various embodiments, a sensor device, may include an electronic device, which includes a semiconductor substrate having at least one integrated circuit and a MEMS sensor, the MEMS sensor including a membrane, a back cavity within the semiconductor substrate arranged below the MEMS sensor and extending to a back side of the semiconductor substrate, and a suspension structure suspending at least the membrane of the MEMS sensor in the semiconductor substrate; a molding partially encapsulating the semiconductor substrate. The sensor device may further include a sensor port having an opening in the molding at a front side of the substrate exposing at least the MEMS sensor membrane to an environment outside the sensor device. The at least one integrated circuit and the MEMS sensor may be monolithically integrated in a semiconductor substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A-3J are views of stages of a substrate being processed to form a sensor device according to at least one exemplary embodiment;

FIGS. 6A-6C show substrates including conventional springs.

FIGS. 7A-7F show substrates including springs according to at least one exemplary embodiment.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "connection" may include both an indirect "connection" and a direct "connection".

When referring to semiconductor devices, at least two-terminal devices are meant, an example is a diode. Semiconductor devices can also be three-terminal devices such as field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits may include a plurality of integrated devices.

In various embodiments a sensor device includes at least one integrated circuit and a MEMS sensor which are both monolithically integrated in a semiconductor substrate or wafer. In accordance with various embodiments, suspension structures described herein are incorporated or formed in the substrate/wafer. The suspension structure may be spring(s) or a spring formed in the substrate or wafer.

Figure 1:
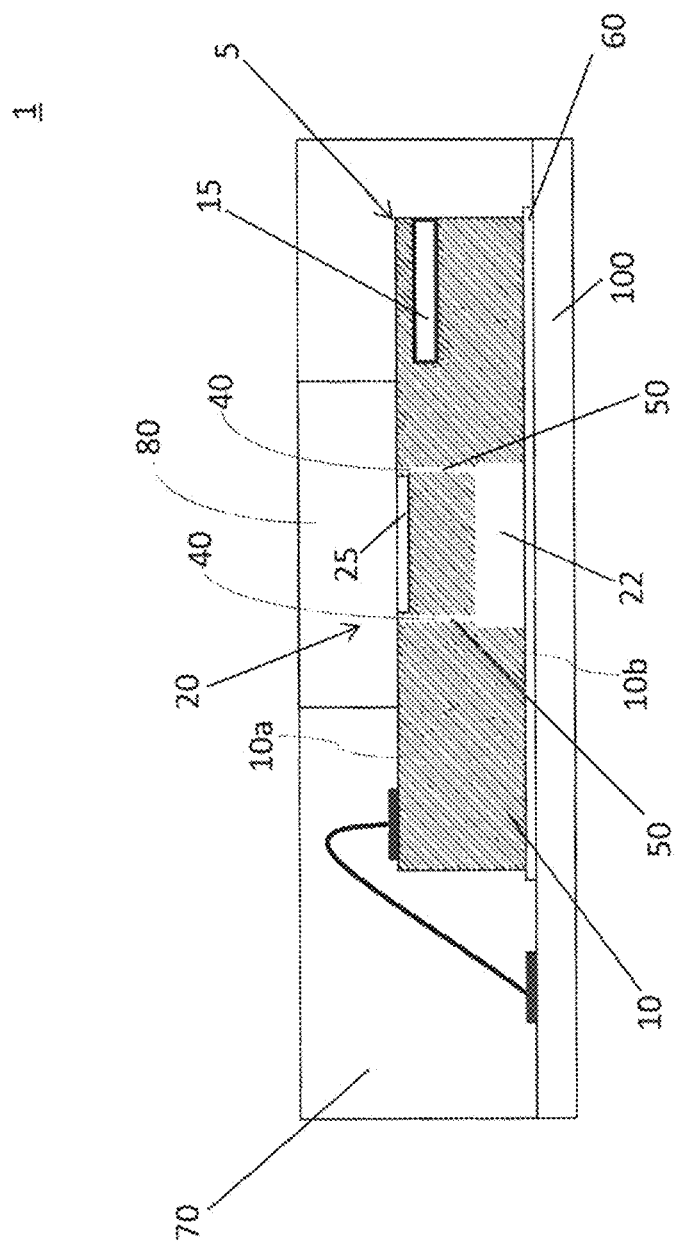
FIG. 1 shows a cross-sectional view of an embodiment of a sensor device including at least one integrated circuit device and a MEMS sensor monolithically integrated according to at least one exemplary embodiment.

FIG. 1 shows a cross-sectional view and representation of a sensor device 1 including at least one integrated circuit device and a MEMS sensor monolithically integrated in or on a substrate according to an exemplary embodiment. In FIG. 1, the sensor device includes an electronic device 5. The electronic device 5 may, for example, be a semiconductor chip or a part thereof. The electronic device 5 shown in FIG. 1 includes a semiconductor substrate 10 having at least one integrated circuit device 15 and a MEMS sensor 20. In accordance with various embodiments, the integrated circuit device 15 and the MEMS sensor 20 are each monolithically integrated in the semiconductor substrate 10.

The substrate 10 and other semiconductor layer(s) or wafer(s) described herein can be made of any suitable semiconductor material. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminum gallium nitride (AlGaN), indium gallium phosphide (InGaPa) or indium gallium arsenide phosphide (In—GaAsP), and binary or ternary II-VI semiconductor materials such as cadmium telluride (CdTe) and mercury cadmium telluride (HgCdTe) to name few.

In various embodiments, the at least one integrated circuit device 15 may be an application-specific integrated circuit (ASIC). The at least one integrated circuit may also include semiconductor devices (e.g., transistors, diodes) or other circuit elements, such as, for example, resistors, capacitors, etc. fabricated using known semiconductor processes.

The MEMS sensor 20 may include one or more sensing elements 25, such as membrane or any other type of sensor element. In various embodiments, the MEMS sensor 20 may be a pressure sensor with a membrane/diaphragm.

The substrate 10 of FIG. 1 includes a back cavity 22 located below the MEMS sensor 20. That is the MEMS sensor 20 at least partially covers the back cavity. The back cavity 22 is formed within the substrate 10 and extends from a bottom surface 10*b* of the substrate to within a predefined distance of the MEMS sensor.

The substrate 10 of FIG. 1 includes a suspension structure 50 (not shown). The suspension structure 50 can suspend the MEMS sensor 20 to provide mechanical stress decoupling.

The suspension structure 50 of FIG. 1 can be formed and reside within trenches 40. The trenches 40 may at least partially surround the MEMS sensor 20. As shown in FIG. 1, the trenches 40 extend from a front-side 10*a* of the substrate 10 to reach the back cavity 22.

The electronic device 5 of FIG. 1 is partially encapsulated. A molding 70 covers sidewalls of the substrate 10 as well as sections of the front-side 10*a* of the substrate 10 so as to form an opening or sensor port 80 in the molding. The opening or sensor port 80 provides an opening in the molding 80 that exposes a section of the front side 10*a* of the substrate 10 and to the MEMS sensor 25 and further, provides an opening or passageway between the MEMS sensor membrane and an environment outside the sensing device 1. For example, in the case of a pressure sensor, a sensor port such as the sensor port 80 can expose the membrane of the pressure sensor to an environment of the sensing device 1.

The molding 70 may be formed by any suitable molding process, such as, for example, using film assisted molding (FAM) technology in one exemplary embodiment. In another embodiment, the sensor port 80 may be formed using through lithography, using, for example, using SU8 photoresist to create the sensor port 80 through etching.

FIG. 1 further shows electronic device 5 mounted to a carrier 100. The substrate 10 may be attached or adhered to the carrier 100 by means of an adhesive 60, such as for example, conductive and non-conductive epoxy glue, die attach film, silicone glue, and/or a wafer back coating, to name a few.

In various embodiments, the suspension structure 50 can provide stress decoupling on the chip level or package level. The suspension structure 50 may be in the form of spring(s). The trenches 40 may be formed, through a trench etching process that produces the spring(s) or spring structure. The trenches 40, that is, may define the springs providing suspension to the MEMS sensor 20.

Figure 2:
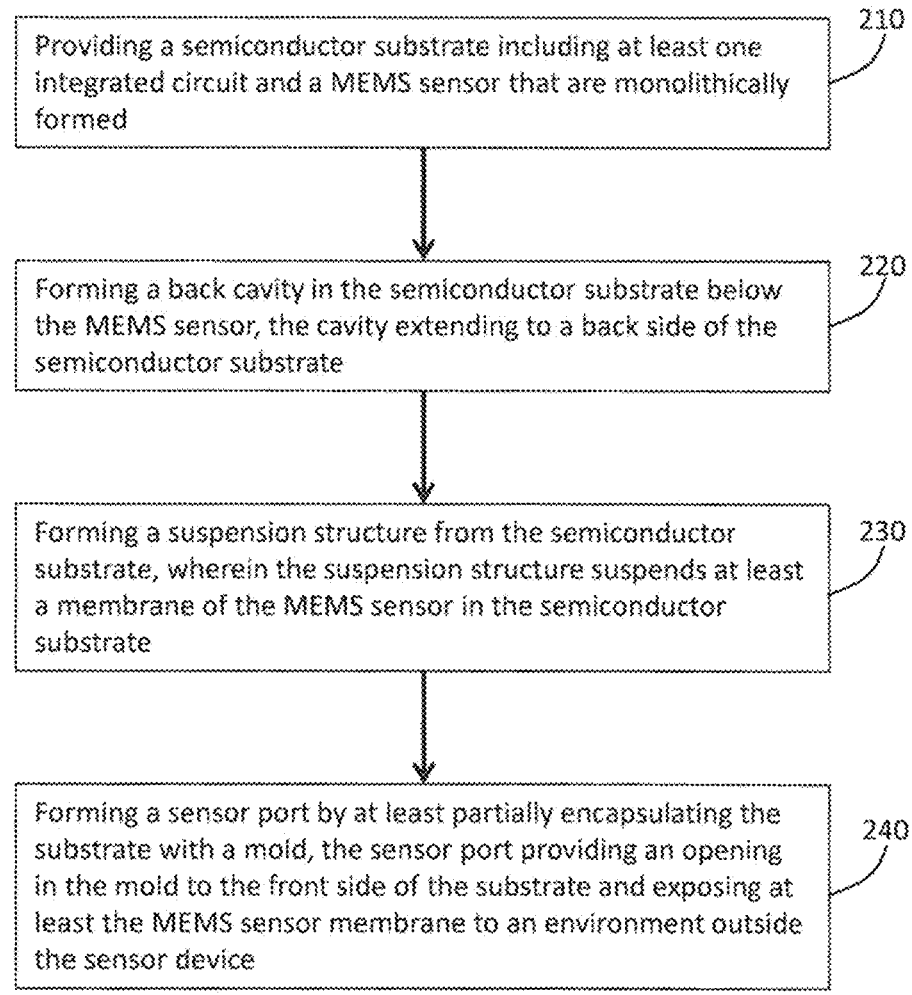
FIG. 2 is a flow chart of a method for manufacturing a sensor device including at least one integrated circuit device and a MEMS sensor monolithically integrated according to at least one exemplary embodiment.

FIG. 2 shows a flow chart for manufacturing a sensor device including a MEMS sensor and one or more integrated circuit devices each monolithically in a substrate of the sensor device according to one or more exemplary embodiments.

FIGS. 3A-3G are cross-sectional views a semiconductor substrate in various stages in forming a sensor device with monolithically integrated MEMS sensor and one or more integrated circuit devices according to exemplary embodiments.

Referring to FIG. 2, a semiconductor substrate is provided including at least one integrated circuit and a MEMS sensor. In at least one embodiment, the at least one integrated circuit and the MEMS sensor are monolithically formed in the semiconductor substrate. The at least one integrated circuit and the MEMS sensor can be formed at one side of the semiconductor substrate, such as, for example, a front side of the substrate. The at least one integrated circuit may be formed using any suitable and well known semiconductor and MEMS manufacturing techniques, e.g., deposition, etching, lithography, etc. In embodiments, the at least one MEMS sensor and the at least one integrated circuit may be formed in any appropriate or suitable order.

FIG. 3A shows of a portion 310 of a semiconductor substrate 300. That is, the semiconductor substrate 310 may be disposed on or over one or more other semiconductor layers, as is shown later. The semiconductor substrate 300 may be a section of a wafer, such as after singulation. The substrate portion 310 includes a logic field section 310*a* laterally adjacent to a sensor field section 310*b*. The logic field section 310*a* may contain or include at least one logic device, such as an ASIC, FPGA, etc. The sensor field section 310*b* may contain at least one sensor device, e.g., a MEMS sensor.

Further, the upper portion 310 may initially include a partially formed sensor device, e.g., pressure sensor or other type of sensor. In this case, the sensor field 310*b* includes electrodes terminals 320 and a fixed electrode 330 therebetween. The electrode terminals 320 may be made formed using any suitable material such as, silicon oxide, in one example. Further, as shown, a sacrificial layer 340 may be formed over the upper substrate portion 310. In the embodiment of FIG. 3A, the sacrificial layer 340 includes layers of nitride and carbon that are disposed over or on the logic field 310*a* and the sensor 310*b* and used for forming a diaphragm, or other types of sensor elements. In other embodiments, the sacrificial layer may include one or more other types layers including other materials, such as, for example silicon oxide, polyimide, and one or more metals (e.g. aluminum).

Next, in the embodiment of FIG. 3B, the sacrificial layer 340 has been patterned to form a patterned sacrificial layer 340*a*. The sacrificial layer 340 may be etched by removing one or portions of the sacrificial layer 340 over the sensor field 310*b*. The sacrificial layer 340 can be patterned using any suitable etching or lithography process or technique.

After forming the patterned sacrificial layer 340*a*, a membrane layer 350 can be formed or provided over the substrate portion 310 as shown in the embodiment of FIG. 3C. The membrane layer 350 is shown deposited over the sensor field 310b and deposited over the logic field 310a. A resist 360 is also shown selectively deposited over the membrane layer 350 for use in patterning the membrane layer 350. The membrane layer 350 may be any suitable material, including polysilicon as one example.

The embodiment of FIG. 3D shows the upper substrate portion 310 including a MEMS sensor, e.g., a MEMS pressure sensor 375 and a logic device 380. In FIG. 3D, the membrane layer 350 in FIG. 3C has been patterned. The membrane layer 350 may be patterned through a lithographic process or any other suitable or viable method. Also as shown in FIG. 3D, the patterned sacrificial layer 340a has been removed leaving a cavity 355. As a result, the patterned membrane layer 350 is a free or substantially free-hanging membrane 370. In accordance with exemplary embodiments, the may be removed through etching. In one example where the sacrificial layer includes a carbon layer, the carbon layer can be etched and thereby removed using and oxygen-plasma etching. In other embodiments, a wet etch may be used, at least in part. For example, hydrofluoric acid may be used to remove a silicon oxide layer of the sacrificial layer.

The materials used or produced in the membrane patterning, e.g., resist, residue, etc. can also be removed. After removal of such materials, one or more back-end-of-line (BEOL) layers may be formed or deposited over or on the front side of the substrate portion 310 and becoming a part of the substrate 300. The one or more BEOL layers may include structures such as one or more dielectric layers, one or more conductive layers, one or more interconnect structures, and the like, to name a few.

In the embodiment of FIG. 3E a logic device 380 and a MEMS sensor 375 are each monolithically integrated in or on the semiconductor substrate 300. As shown, the substrate 300 includes one or more BEOL layers 390 disposed over a semiconductor layer or wafer 385, and e.g. disposed over the logic device 390 over one or more sections of the MEMS sensor 375. However, the membrane 370 of the MEMS sensor 375 is uncovered or exposed. That is, in FIG. 3E, the one or more BEOL layers 390 are not formed over at least a section of the MEMS sensor 370 including the membrane 370.

The semiconductor layer 385 may include any suitable of semiconductor material, such as silicon and the like.

Referring back to FIG. 2, a semiconductor substrate has been provided with a monolithically integrated MEMS sensor and at least one integrated circuit, and then a back cavity in the semiconductor substrate can be formed at 220 and a suspension structure from the semiconductor substrate at 230. The back cavity and suspension structure may be separately, in any order, e.g., the back cavity can be formed first and the suspension structure second or vice versa. Further, the back cavity 325 and suspension structure can also be formed simultaneously or nearly simultaneously. In accordance with various embodiments, the cavity and suspension structure may be formed using an one more etching processes, such as, for example using a reactive ion etching process e.g., deep reactive ion etching (DRIE).

In forming the back cavity and/or the suspension structure, the substrate may be placed on a temporary carrier. For example, the front-side of the substrate may be attached to a temporary carrier when the back cavity is being formed and/or the back side of the substrate may be attached to a temporary or permanent carrier when the front side suspension structure is being formed.

The embodiment of FIG. 3F shows the substrate 300 of FIG. 3E including a back cavity 325 and suspension structure 392. The suspension structure 392 includes one or more trenches 394. The trenches 394 composing the suspension structure 392 and the back cavity may be formed through deep reactive ion etching (DRIE). Prior to etching, a resist 395 may be deposited on the substrate for etching.

The embodiment of FIG. 3G shows the substrate 300 of FIG. 3F after removal of any resist or other materials used or produced by etching. The trenches 392 extend from a front side 301a of the substrate 300 to the back cavity 325. The back cavity 325 extends from a back side 301b of the substrate 300 to a predetermined a height in the substrate 300, such as, for example, to or within a predetermined height in the semiconductor layer 385.

The one or more trenches 392 may be etched or formed so as to produce a suspension structure 394 that provides mechanical stress decoupling to the MEMS sensor 375. The suspension structure 392 suspends the MEMS sensor 375 in the substrate 300 over the back cavity 325.

In accordance with one or more exemplary embodiments, the suspension structure 392 may be in the form of one or more mechanical springs formed in and/or from the substrate 300. That is the spring may include the various layers composing the substrate 300, such as, for example, include parts or sections of one or more of metallization layers, dielectric layers, passivation layers, semiconductor layers, etc.

Figure 3H:
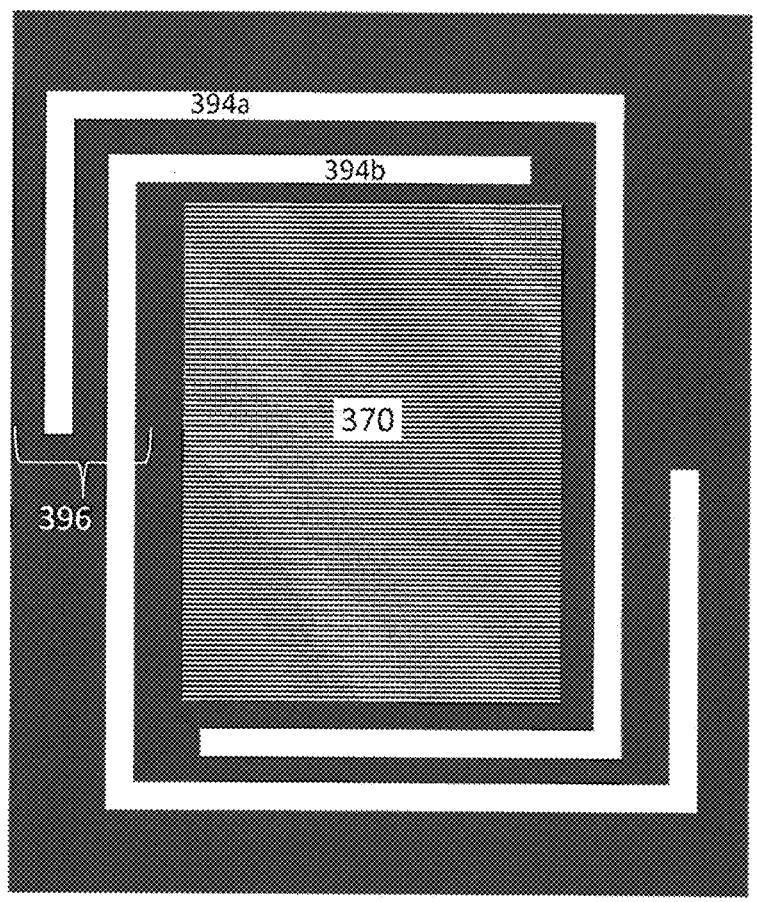

FIG. 3H is a top cross-sectional view of substrate 300 along the line A-A in FIG. 3G. In FIG. 3H, the suspension structure 392 is shown surrounding the membrane 370 of the MEMS sensor 375. The suspension structure 392 includes trenches 394 that have been patterned. The trenches 394 define a spring structure 396. The spring structure 396 extends vertically through the substrate 300. As shown in FIG. 3G and FIG. 3H, the spring structure 396 includes one or more vertical sections 394a of the substrate 300. The vertical sections 394a are at least partially separated from one or more other vertical sections of the substrate 300 by one or more spaces or gaps in the substrate. The spring(s) or sprint structure 396 is adjacent and/or between the trenches 394.

Figure 5A:
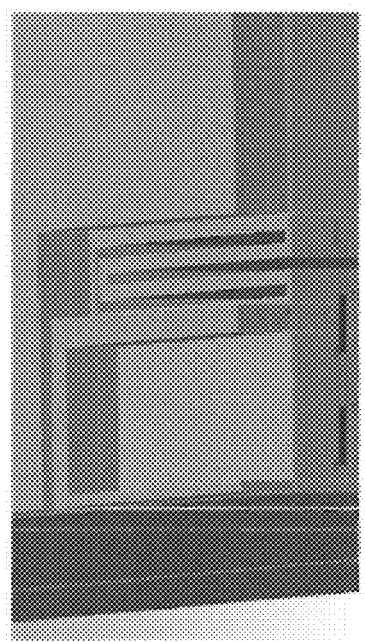
FIG. 5A shows a perspective view of a suspension structure of a substrate according to at least one exemplary embodiment.
Figure 5B:
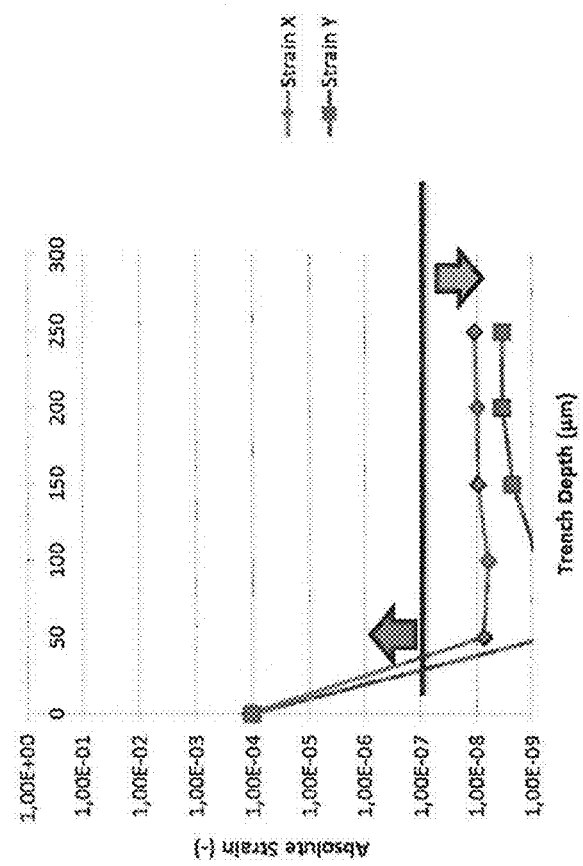
FIG. 5B is a graph showing indicating the strain or stress decoupling of the suspension structure of FIG. 5A according to at least one exemplary embodiment.

FIG. 5A shows a partial perspective view of trenches 394 and spring structure 396 according to various embodiments. FIG. 5B shows a simulation of the absolute strain of a spring structure of FIG. 5A in the XY plane (the XY plane being parallel to a surface at the top side 301a of the substrate 300 facing away from the back cavity 325).

Referring back to FIG. 3H, the spring structure 396 may include or provide an electrical connection between the MEMS sensor 375 and the logic device 380. As previously noted, the spring structure 396 can include one or more metallization layers, any of which may electrically connect to the MEMS sensor 375 or a part thereof (e.g., electrode 330). Similarly, the spring structure 396 may electrically connect to any component or device, either within or outside the substrate 300.

The spring structure 396 and trenches 394 shown in FIG. 3H extend from the back cavity 325 towards the front side 301a of the substrate 300. That is, the trenches 394 may extend through one or more semiconductor layers, conductive or metallization layers, dielectric layers, etc. In other embodiments, the trenches 394 and/or spring structure 396 may not extend all the way to the substrate front side 301a.

FIG. 3H shows one possible pattern arrangement including two trenches 394a, 394b. In FIG. 3H each of the trenches 394 includes trench segments connected to each other at right-angles. Each trench 394a and 394b have a spiral-like structure where each trench 394a and 394b is both inner and outer to each with respect to the sensor 370 and that the sensor 370 is surrounded by at least one of the trenches 394. Of course the number of trenches used to form the springs 396 or suspension structure 392 can vary. Further, the pattern of the trenches 394 may also vary. That is the trenches 394 need not be formed or arranged in straight-line segments, but may include one or more curved, wavy, or other types of sections. Further the trenches 394 may not be formed or arranged in a spiral-like pattern. In short, other variations may be realized.

In the embodiment of FIG. 3I, the substrate 300 of FIG. 3G is mounted or attached to a carrier 100. The carrier 100 may be an insulating or an electrically conductive carrier, and/or may function as a heat sink.

As previously explained the substrate 300 may include one or more interconnect structures. In FIG. 3I an interconnect structure is electrically connected to carrier 100 via a bond wire 315 and bond pad 316. In other embodiments, the substrate 300 may include one or more additional interconnect structures that may later be connected to other components or devices that are not shown.

Referring back to FIG. 2, after forming a suspension structure and a back cavity, at 240 a sensor port can be formed by or through at least partially encapsulating the substrate with a mold. The sensor port is an opening in the mold at the front side of the substrate and exposing at least a portion of the MEMS sensor (e.g., membrane) to an environment outside the sensor device.

In various embodiments, the sensor port through an encapsulation process. Any suitable encapsulation process may be used, including a film-assisted molding (FAM) process, as one example. A FAM process may use one or two mold films (e.g., plastic films) in a mold. In one example of a FAM process, a mold film is sucked down into the inner surfaces of a mold (e.g., culls, runners, cavities, etc.) before the lead frames or substrates (e.g., the products to be encapsulated) are loaded into the mold. This is followed by the usual transfer molding process. The molding material may first be liquefied by heat and pressure, and then forced into closed mold cavities and held there under additional heat and pressure until the molding material is solidified or cured. After curing the molding material, the mold is opened with the now encapsulated product(s) then being unloaded. Next, the vacuum is removed and the film is transported across one length of the mold or renewed and a new cycle can start. A FAM process makes it possible to create open or windowed packages by means of placing inserts in the bottom and/or top mold.

The embodiment of FIG. 3J shows the substrate 300 of FIG. 3I in a partial mold environment during a FAM process. That is, the substrate 300 is located within a mold that is partially shown. FIG. 3J shows an upper mold part 77 with a mold film 75 is vacuum drawn or sucked onto a surface 77a of the upper mold part 77. In accordance with various embodiments, the substrate 300 is sealed in a mold so that the upper mold 77 disposed against the upper side 301a of the substrate 300.

After the substrate 300 is placed in the mold, molding material 70 can be injected into the mold. In FIG. 3J, the molding material 70 at least partially encapsulates the substrate 300 and covers one or more sidewalls of the substrate 300 and one or more sections of the upper side 301a of the substrate 300. An insertion or protrusion section 78 of the upper mold 77 presses against the upper side 301a of substrate 300 to create a window. When the molding material 70 is injected, the protrusion section 78 located over the MEMS sensor 375 prevents the molding material 70 from forming over the MEMS sensor 375.

Figure 4A:
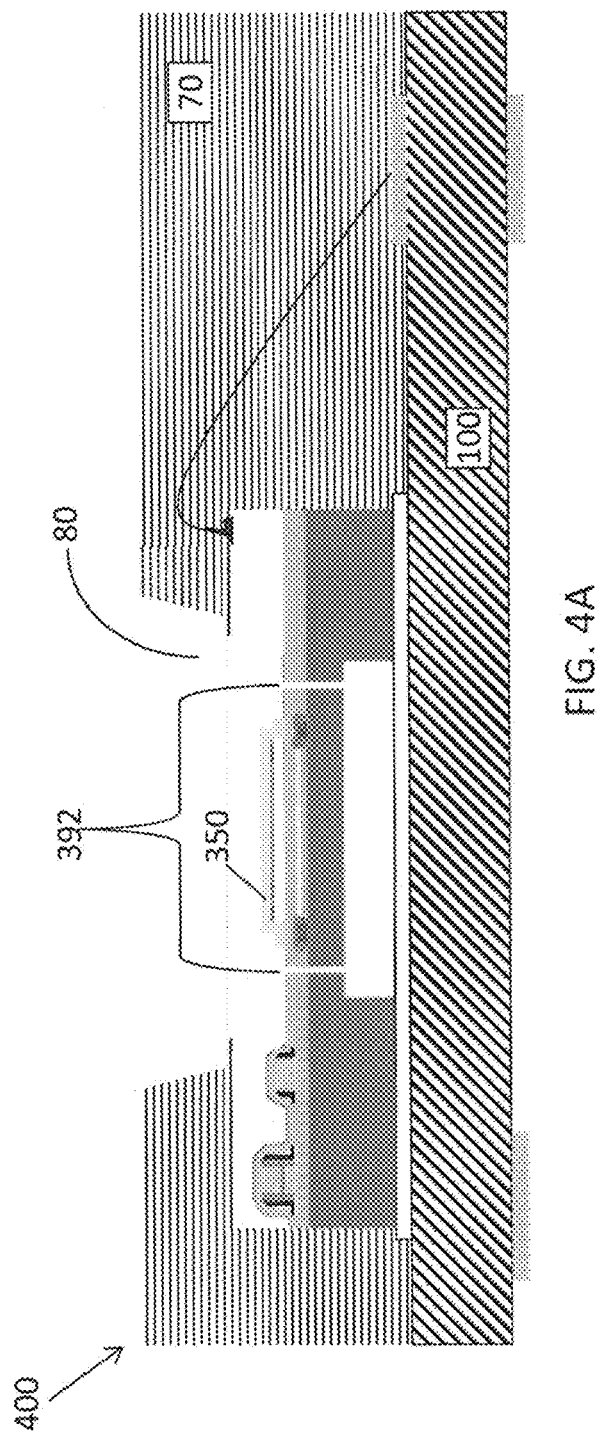
FIGS. 4A-4C show a cross-sectional, a top perspective view, and a top cross-sectional perspective view of a sensor device including at least one integrated circuit device and a MEMS sensor monolithically integrated on a substrate of according to at least one exemplary embodiment.
Figure 4C:
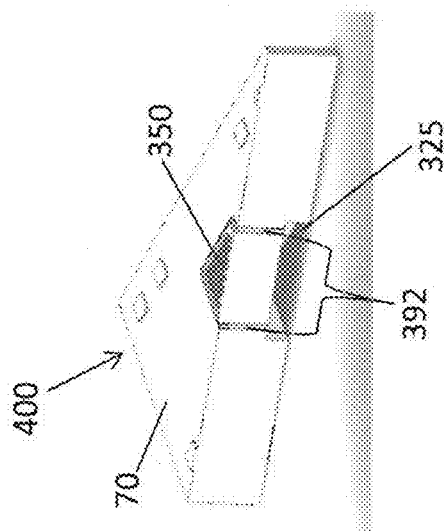
Figure 4B:
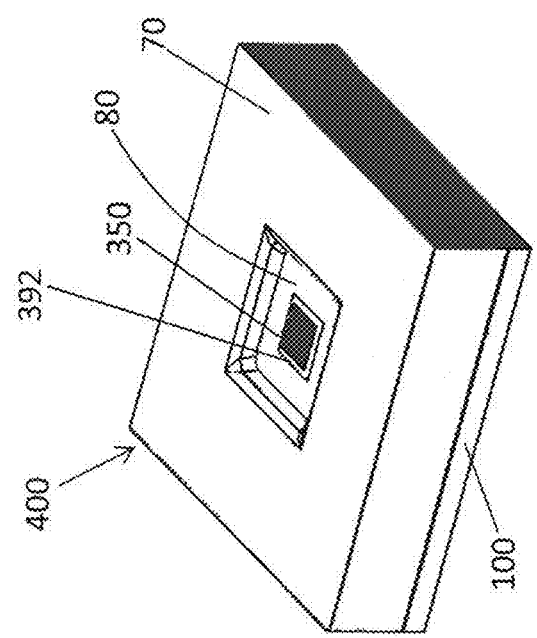

FIGS. 4A-4C show several views of an electronic device 400 according to various embodiments. The device 400 includes the substrate 300 of FIG. 3J after encapsulation and mounted on a carrier 100. The molding material 70 has been cured or hardened and contains a sensor port 80. The sensor port 80 provides an opening or passage between the MEMS sensor 375 and environment outside the electronic device 100. The sensor port 80 can allow pressure waves, sound waves, light, or other phenomena originating from can outside the electronic device 400 to reach the MEMS sensor 375, and e.g. the membrane 350, (or other sensing element in other embodiments).

In accordance with various embodiments the spring structure 392 is configured to absorb and/or reduce stresses. The spring structure 392 can absorb and/or reduce the effect of vibrations occurring in the device 400. For example, the spring structure 392 can absorb or reduce mechanical stresses, caused or produced as a result of thermal expansion and/or contraction of device components or materials. Furthermore, the spring structure reduces or eliminates mechanical stresses resulting from mounting the device on a larger PCB (printed circuit board).

During an operation of the sensor device 400 or other sensor devices described herein, pressure or acoustical waves may enter through the sensor port 80 and reach the MEMS sensor 375 to cause vibration of the membrane 370. The vibrating membrane 370 can cause corresponding changes to an electrical field between the membrane and the electrode 330 thus producing an electromagnetic field. This resulting electromagnetic field may create or generate an electric signal corresponding to the pressure wave or acoustic wave entering the sensor port 80 and causing the membrane 370 to vibrate. This electric signal may then be processed by any device, e.g., logic device 380 or another external device (not shown).

While in various embodiments, MEMS sensors have been described as pressure sensors, other types of MEMS sensors may be used instead. For example the MEMS sensor 375 need not be a pressures sensor but may be any other appropriate MEMS sensor, such as, an ultrasound transducer, in one example. In this regard, the membrane 370 may instead be other types of appropriate sensing elements. In accordance with various embodiments, MEMS sensors described herein may be a pressure sensor, gas sensor, a microphone, or the like, to name a few.

FIGS. 6A-6C show views of a substrate 600 including various conventional suspension structures. The substrate 600 may be a semiconductor substrate (e.g., silicon) and may be, for example, in the form of a chip frame.

FIG. 6A is a partial perspective three-dimensional view of the substrate 600 including a MEMS device. A section of the substrate 600 has been removed for visual illustrative reasons. The area occupied or to be occupied by the MEMS device, or other device may be referred to as device area, designated 620 in this embodiment. The device area 620 is connected to a suspension structure 625 that includes a plurality of springs 610 in one known configuration. FIGS. 6B and 6C are top views of chip frame 600 depicting different configurations of suspension structure 625. As shown in FIGS. 6A-6C, the springs 610 are depicted as line segments for illustrative purposes, but would otherwise have a vertical dimension, e.g., a height or depth.

As noted, in FIG. 6A a section or part of the substrate 600 including some of the springs 610 have been removed so that inner arrangement of the springs 610 can be more clearly depicted.

FIGS. 6A-6C depict conventional suspension structures 625 including springs 610. Each of these springs 610 extend predominantly in a single dimension or in a single dimension between the device area 620 and the substrate 600. That is, each of the springs 610 are limited in the sense that one or major portions or springs extend only in one direction. In other words, each the springs 610 generally do not or cannot provide mechanical decoupling or significant decoupling in more than one lateral dimension.

As one example, each of the springs 610 shown in FIG. 6B has one major spring portion or segment 611. The spring portion 611 only extends in a single direction with the spring portion 611 facing and being parallel to a peripheral side of the MEMS device/area 620. However, none of the springs extend around the MEMS device/area 620. That is none surround or enfold around any of the corners or bends of the MEMS device/area 620. Similarly as shown in FIG. 6C, the spring segments 611 and 613 are folded over each other and also only extend in a single direction.

In accordance with exemplary embodiments of the present disclosure, suspension structures or springs described herein may have different configurations with improved performance characteristics, especially with regard to providing mechanical decoupling.

According to exemplary embodiments of the present disclosure, FIGS. 7A-7F each depict a top view of semiconductor substrate 700 respectively with springs 710a-710f. The springs 710a-710f may be formed in accordance with any suitable manufacturing techniques, including manufacturing techniques described herein. The substrate 700 may connected, e.g., electrically and/or physically connected to other device or elements. In some embodiments, the substrate 700 may further include one or more other devices, for example, at least one integrated circuit that is monolithically integrated in the substrate 700. The substrate 700 may include a device, for example, a MEMS device that is formed and/or located in device area 700. The device, for example MEMS device, other devices, and/or the springs 710a-170f may be formed in accordance with embodiments described herein. Other types of devices, for example other than MEMS devices, may be located and/or formed in the device area 720. A cavity or back cavity may be formed in the substrate 700 below the device area.

In the exemplary embodiment shown in FIG. 7A, the substrate 700 includes a plurality of springs 710a. Each of the springs 710a includes at least two spring segments or portions, designated 711a and 713a. The spring portions 711a and 713a can be considered together as an L-shaped portion. These portions meet each other at 90 degrees or substantially 90 degrees. An L-shaped portion such as the one formed from spring portions 711a and 713a may partially enclose, enfold, or surround a section of the device area. In FIG. 7A, the L-shaped portion including portions 711a and 713a wraps around a corner or a section of the device area 720.

Further in the embodiment of FIG. 7A, the spring portions 711a and 713 do not extend in a lateral direction (in the XY plane) beyond or past more than one than one edge, side or distinct boundary of the device area 720 to which the respective portion 711a or 713 faces. For example, the spring portion 711a only extends past dashed line "a" which corresponds to a boundary or peripheral side of the device area 720. Similarly, the spring portion 713b only extends past dashed line "b", corresponding to another boundary or peripheral side of the device area 720.

Further, the spring segments 711a and 713a may each be parallel to and face a different side or section of the periphery of a device area, as shown in FIG. 7A with respect to the device area 720. The spring 710a includes a spring portion that connects or attaches the spring portion 711a to the device area 720 and includes another portion that connects or attaches the spring portion 713a to the substrate 700.

The springs 710a as arranged in FIG. 7A do not overlap each other in the sense that each of the springs 710a covers or masks a different section or area of the periphery of the device area 720. The springs 710a of FIG. 7A appear identical or having the same dimensions. However this is not necessarily so, and in other embodiments one or more of the springs 710a may have different dimensions, e.g., have lengths or thicknesses that differ from at least one other spring. The dimensions the springs 710a may depend at least in part on the dimensions of the device area 720.

In the exemplary embodiment of FIG. 7B, the substrate 700 includes a plurality of springs 710b. Each of the springs 710b includes an L-shaped spring portion including segments or spring portions 711b and 713b. The spring portions 711b and 713b meet each other at right-angles or approximately 90 degrees. As shown, the spring segments or spring portions 711b and 713 are orthogonal or substantially orthogonal to each other. In other embodiments, the angles in which the spring portions meet may vary, for example up to 5-10% deviation from a right angle in one example.

Each of the spring portions 711b and 713b of FIG. 7B extend past or beyond at least one of the outermost boundary or side/edge of the MEMS device area 720. For example, the spring portion 711b in FIG. 7B extends past a dash-line "b" which corresponds to a boundary of the device area.

Further, the spring portion 713b extends beyond two sides or outermost boundaries of the device area 720. In other words, the spring portion 713b may have a length greater than a width or length of the MEMS device area 720 from an overhead perspective or within the XY plane. The MEMS device area 720 in FIG. 7B is depicted as rectangular (which is not necessarily so) with the spring portion 713b having a length greater than a length of the corresponding side of periphery of the device area 720 to which the spring portion 713b faces. As shown, the spring portion 713 reaches or meets the substrate 700.

Further, the spring portion 711b may extend beyond an outermost boundary or edge of the device area 720 so as to reach or meet the spring portion 713b. The spring portion 711b extends past a second end or extreme of the same boundary of the device area so as to reach the portion 713b. That is the spring portion 711b also has a length greater than greater than a length of the side/boundary of area 720 facing the spring portion. In other embodiments, the length of the spring portion 711b may be less, and may begin a position corresponding to an end the side/boundary of the device area facing the spring portion 711b.

The spring 710b in FIG. 7B includes a spring portion that connects or attaches spring portion 711b to the device area 720 and further includes another portion that connects or attaches the portion 713b to the substrate 700.

In the exemplary embodiment shown in FIG. 7C, the substrate 700 includes a plurality of springs 710c. The springs 710c may be similar to the springs 710b of FIG. 7B, but arranged differently. The springs 710c, like the springs 710b, each include an L-shaped portion including spring segments or portions 711c and 713c that are orthogonal or substantially orthogonal to each other. In FIG. 7B, the springs 710b do not overlap, with each of the springs 710b covering, masking, or facing different sides or areas of the periphery of device area 720. However in the exemplary embodiment of FIG. 7C, the springs 710c are arranged in an intertwined spiral or spiral-shaped pattern, and more specifically in an intertwined square or rectangular-like spiral pattern. In other embodiments, the springs 710c may be arranged in other type of spiral patterns, including, for example, in an intertwined circular or oval spiral pattern and the like, to name a few.

In the embodiment of FIG. 7C, each of the springs 710c begins from a different part, e.g., section, boundary, or side of the periphery of MEMS area 720. Further, the springs 710c are arranged so that each peripheral side of the device area 720 is laterally covered or masked by spring segments or portions of the respective springs 710c. The springs 710c enclose the device area 720. Each of the springs 710c as shown includes an L-shaped spring portion that faces or at least partially masks sides of the periphery of the MEMS device area 720.

The exemplary embodiment shown of FIG. 7D depicts the substrate 700 including a plurality of springs 710d. The springs 710d of FIG. 7D are similar to the springs 710c of FIG. 7C in that they are also arranged in an intertwined spiral or spiral-like pattern. The springs 710d of FIG. 7D, as arranged, surround the device area 720. The springs 710d, in other embodiments, may also be arranged in other types of spiral patterns as previously described herein.

In the embodiment of FIG. 7D, the device area 720 is rectangular, each peripheral side of facing or being covered or masked by spring segments or portions of the springs 710c. The springs 710d includes a C-shaped portion. The springs 710d, at least partially face or cover three sides or sections of the periphery of the device area 720. As can be seen, a difference between the springs 710d and springs 710c are that the springs 710d have a C-shaped portion instead of a single L-shaped portion. As shown, each of the springs 710d the C-shape portion includes spring segment or portions 711d, 713d, and 715d. The C-shaped portion of springs 710d can be described as two L-shaped portions, sharing a common spring segment 713d.

In the embodiment of FIG. 7D, the spring portion 711d connects or attaches to the device area 720 via another spring segment or portion. Further, the spring portion 715d of FIG. 7D directly connects or attaches to the substrate 700. In other embodiments, the spring portion 715d may indirectly connect to the substrate via one or more other spring segments.

While the exemplary embodiments of FIGS. 7C and 7D respectively show springs 710c and 710d bending around a device area 720 two times (with L-shaped portion) and three times (with a C-shaped portion), in other embodiments the springs may further extend out and spiral around the device area 720 in the same spiral manner. For example, in the case where a MEMS device area is rectangular like in FIG. 7D, a spring may extend and spiral around the device area 720 multiple times.

Further, while in each of the embodiments of FIGS. 7C and 7D a set of four springs are depicted, the amount of springs may vary. For example, a substrate such as substrate 700 may include only one, two, three, four or more distinct springs that spiral around a device area 720.

The exemplary embodiment of FIG. 7E depicts the substrate 700 including springs 710e with folds. Each of the springs 710e includes spring folds 712e and 714e. As shown, the spring fold 712e includes spring portions 711e, 716e, and 713e. The spring portion 713e can be considered as "folded" over the spring portion 711e, or vice versa. The spring portion 716e may be considered a "bend" in the fold 712e that connects the spring portion 711e to the spring portion 713e. Similarly the spring fold 714e includes spring segments or portions 715e, 717e, and 718e. In the spring 710e, the spring fold 712e connects or attaches to the spring fold 714e. More specifically in the embodiment of FIG. 7E, the spring portion 713e of the spring fold 712e meets or connects to the spring portion 715e of the spring fold 714e.

As shown in the exemplary embodiment of FIG. 7E, the spring fold 712e is orthogonal or substantially orthogonal to the spring fold 714e. That is the spring portions 711e and 713e of the spring fold 712e are orthogonal or substantially orthogonal to the spring portions 715e and 717e of the spring fold 714e.

Furthermore, each of the springs 710e partially enclose or surround the periphery of the device area 720. In the embodiment of FIG. 7E, the device area 720 is rectangular with each spring fold 712e and 714e of facing and/or arranged parallel to a different side of the periphery of the device area 720.

The exemplary embodiment of FIG. 7F also depicts the substrate 700 with springs 710f having folds. However, each of the springs 710f includes a single fold 712f instead of two folds as in the case of the springs 710e. The fold 712f of FIG. 7F includes an inner spring portion 711f and an outer spring portion 713f. The spring portions 711f and 713f are L-shaped spring portions as previously discussed herein. The outer spring portion 713f covers or folds over the inner spring portion 711f. Since the spring fold 712f includes two L-shaped spring portions, the spring fold 712f extends in two orthogonal or substantially directions within the xy plane.

In FIG. 7F, the springs 710f together surround the periphery of the device area with each of the springs 710f partially enclosing or surrounding the periphery of the device area 720.

In accordance with exemplary embodiments, trenches may be created to form or define springs 710a-710f. For example, trenches may be formed through deep reactive ion etching (DRIE) as previously explained or discussed in various embodiments disclosed herein. The trenches, like the springs 710a-710f may be formed vertically, or in direction perpendicular to the displayed XY plane. The trenches may define the structure, shape(s), and/or configuration of the springs 710a-710f. For example, in the embodiments of FIGS. 7A and 7B, the trench or trenches 730 includes or provides gaps next to the spring portions. In general, the gaps between the spring portions or between a spring portion and device area 720 may be the same or may be different from each other. In general, the trenches and the spring or spring portions are configured as straight, and not curved in the XY plane. However, variations in the shape the springs, spring portions or trenches, may include minor or negligible bending with curved or arched sections and the like may be due to normal deviations resulting from manufacturing processes.

Similarly the width of the gaps between the spring portions 711a and 713a and the substrate 700 may be the same or different from each other.

While in the embodiments of FIG. 7A-7B, show a certain amount or number of springs, for example a set of four springs 710a are shown in FIG. 7A, the number of springs 710a used in a substrate may vary and may be any suitable amount. Moreover, the springs 710a-710f may be used with each other, some of the springs 710a-710f may be incorporated with each other and/or with other types of springs in a same substrate. The springs 710a-710f may be used as the springs in connection with the devices previously described herein, for example, devices described in connection with FIGS. 1-4C.

As noted, sensor chips, such as pressure sensor chip and the like in molded packages experience thermal expansion. As a result, the substrate and/chip can experience bending due to thermal expansion and other effects. The decoupling by spring presented herein, for example springs 710a-710f provide significantly better decoupling than known springs.

Figure 8B:
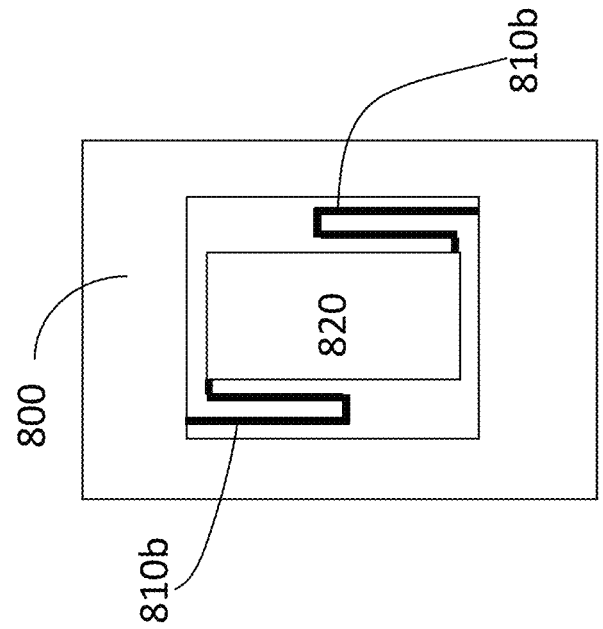
FIGS. 8A-8B show a substrate with springs according to at least one exemplary embodiment.
Figure 8A:
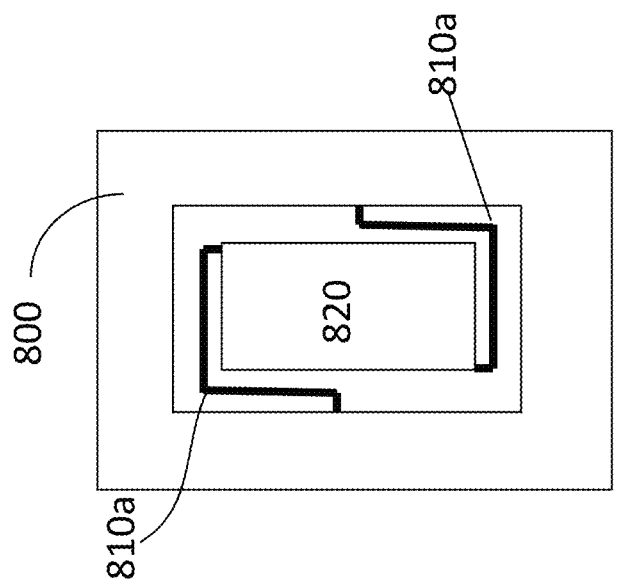

FIG. 8A shows a substrate 800 with a pair of springs 810a, which are similar to the springs 710a of FIG. 7A, while FIG. 8B shows the substrate 800 with a pair of springs 810b that are similar to springs of FIG. 6C. The amount of decoupling provided by the springs 810a, or the stress on the device area 820, e.g., the MEMS device, is reduced by a factor of approximately 50,000. By contrast, the amount of stress reduced by the springs 810b to the device area 820 is only approximately 2000.

It is noted, for example, when an external force makes the chip bend, in case where there is no stress decoupling (e.g., no trenches and no back cavity), the resulting stress acting on the MEMS device can be for example, 1 MPa. (This would be the sum of the absolute normal stress components in x and y directions). However when a stress decoupling structure or feature is introduced, this may result in the stress being reduced to e.g. 0.2 MPa. In this example, the resulting stress reduction factor in this example would be a factor 5.

That is, the structure of configuration of the springs 810a, as well as the springs of FIGS. 7A-7B provide similar or better mechanical decoupling and stress reduction.

In various embodiments a sensor device includes a substrate that includes a MEMS sensor and at least one integrated circuit are monolithically integrated in a substrate, the substrate that have a thickness of approximately 100 μm to approximately 1000 μm.

In various embodiments, the substrate may include a suspension structure that suspends the MEMS sensor over a back cavity. In various embodiments, the suspension structure at least partially surrounds a perimeter of the membrane of the MEMS sensor.

In various embodiments, the suspension structure includes one or more springs formed within the substrate that are adjacent and/or between one or more trenches of the semiconductor substrate. In various embodiments, the one or more trenches extend from the front side of the semiconductor substrate to the back cavity, with the dimensions of trenches having a width of approximately 1 μm to approximately 100 μm, and a depth of approximately 10 μm to approximately 500 μm.

In various embodiments, the substrate is mounted on a carrier.

In various embodiments, the trenches of the suspension structure are formed through deep reactive ion etching (DRIE).

In various embodiments, the sensor device including a molding partially encapsulating the semiconductor substrate. The molding can have an opening for a sensor port that exposes at least a portion of the MEMS sensor, e.g., a membrane/diaphragm, to an environment outside the sensor device.

In various embodiments, the sensor port is formed by at least partially encapsulating the substrate using a film assisted molding process.

In various embodiments, the suspension structure electrically connects the MEMS sensor to the at least one integrated circuit. In various exemplary embodiments, the at least one integrated circuit includes an application specific integrated circuit (ASIC).

In various embodiments, the MEMS sensor is a pressure sensor, and in some embodiments includes a diaphragm or membrane made out of polysilicon.

In various embodiments, a sensor device, may include an electronic device, which includes a semiconductor substrate having at least one integrated circuit and a MEMS sensor, the MEMS sensor including a membrane, a back cavity within the semiconductor substrate arranged below the MEMS sensor and extending to a back side of the semiconductor substrate, and a suspension structure suspending at least the membrane of the MEMS sensor in the semiconductor substrate; a molding partially encapsulating the semiconductor substrate. The sensor device may further include a sensor port having an opening in the molding at a front side of the substrate exposing at least the MEMS sensor membrane to an environment outside the sensor device. The at least one integrated circuit and the MEMS sensor may be monolithically integrated in a semiconductor substrate.

In various embodiments, the sensor device the suspension structure may include a spring structure formed within the semiconductor substrate. The suspension structure may at least partially surround a perimeter of the membrane of the MEMS sensor. The spring structure includes springs formed from the substrate between one or more trenches of the semiconductor substrate. The one or more trenches can extend from the front side of the semiconductor substrate to the back cavity.

In various embodiments, the electronic device is mounted on a carrier. The sensor chip may be attached to the carrier by an adhesive. In some embodiments, the suspension structure electrically connects the MEMS sensor to the at least one integrated circuit device.

The sensor device, in some embodiments, may include the at least one integrated circuit includes, for example, an application specific integrated circuit (ASIC).

In various embodiments, the MEMS sensor is a pressure sensor. The at least one integrated circuit can be electrically coupled to the carrier, for example, via a bond wire that may be encapsulated within the molding.

In accordance with various embodiments, back cavities described herein may be rectangular or rectangular-like. For example the with dimensions of the back cavity may range from approximately 50×50 μm$^2$ to approximately 1000× 1000 μm$^2$. In accordance with various embodiments, back cavities described herein may circular or circular-like with a diameter from approximately 50 μm to approximately 1000 μm. In various embodiments, the back cavities may have a depth from approximately 10 μm to approximately 500 μm.

In accordance with various embodiments, trenches formed in a substrate, such as trenches that may at least partially surround a MEMS sensor may have a width of approximately 1 μm to approximately 20 μm and may have a depth of approximately 10 μm to approximately 500 μm.

In accordance with various embodiments, adhesives described herein may include conductive epoxy glue, non-conductive epoxy glue, die attach film, silicone glue, and/or a wafer back coating, and combinations thereof.

In accordance with various embodiments, sacrificial layers described herein may include one or more layers of nitride, carbon, silicon oxide, polyimide, and of one or more metals, such as aluminum.

In exemplary embodiments of the present disclosure, a device includes a substrate a semiconductor substrate including a device. In various embodiments the device is a MEMS device. In various exemplary embodiments, the MEMS device is monolithically integrated within the substrate.

The substrate may further include a back cavity within the semiconductor substrate arranged below the MEMS device, and includes a suspension structure that suspends and provides mechanical decoupling to at least a portion of the MEMS device in the semiconductor substrate. In exemplary embodiments of the present disclosure, the suspension structure includes one or more springs, wherein the one or more springs are defined by one or more trenches formed within the semiconductor substrate.

In exemplary embodiments, at least one spring of the one or more springs includes at least one L-shape portion. The at least one L-shape portion of the at least one spring may at least partially surround a vertical outer surface or periphery of the MEMS device. The L-shape portion of the at least one spring may include a first spring section and a second spring section that are each respectively substantially parallel a first side or section and a second side or section of the periphery of the MEMS device. In various embodiments, the first and second spring sections may be orthogonal to each other.

In various embodiments, the first spring section of the L-shaped portion of the at least one spring extends beyond at least one edge of the first side of the periphery of the MEMS device, and wherein the second section of the L-shaped portion of the at least one spring extends beyond at least one edge of the second side of the periphery of the MEMS device.

In various embodiments, the first spring section or the second spring section of the L-shaped portion of the at least one spring extends or connects to the semiconductor substrate.

In various embodiments, the first spring section of the L-shaped portion of the at least one spring of has a length greater than a length of the first side the periphery of the MEMS device.

In various embodiments, the second spring section of the L-shaped portion of the at least one spring of has a length greater than a length of the second side of the periphery of the MEMS device.

In various embodiments, the at least one spring including the at least one L-shape portion further includes a spring section extending from the L-shape portion to the MEMS device.

In various embodiments, the at least one spring comprising the at least one L-shape portion further including a further spring section extending from the L-shape portion to the semiconductor substrate.

In various embodiments, the one or more trenches defining the one or more springs vertically extend from the front side of the semiconductor substrate to the back cavity.

In various embodiments, the back cavity extends to a back side of the semiconductor substrate.

In exemplary embodiments of the present disclosure, a device includes a semiconductor substrate includes a MEMS device. In various embodiments, the device includes a back cavity within the semiconductor substrate arranged below the MEMS device, and a suspension structure suspending and providing mechanical decoupling to at least a portion of the MEMS device in the semiconductor substrate, wherein the suspension structure includes comprising a plurality of springs, wherein the plurality springs are defined by one or more trenches formed within the semiconductor substrate.

In various embodiments, each of the plurality of springs each includes a first spring portion and a second spring portion, wherein the first spring portion is joined to or connects to the second spring portion at a right angle or substantially a right angle.

In various embodiments, each of the plurality of springs includes a third spring portion, wherein the third spring portion extends in a direction parallel to a direction either the first spring portion or the second spring portion extends.

In various embodiments, the plurality of springs is arranged in an intertwined spiral pattern.

In various embodiments, the periphery of the MEMS device has four sides, and wherein each of the plurality of springs begins or attaches to at a different respective side of the periphery of the device.

In various embodiments, each of the plurality of springs includes a first fold and a second fold, wherein the first fold and the second fold each includes a set of two spring portions parallel to each other and separated from each other by a gap. Further, in various embodiments, for each spring, the spring portions of the first fold are perpendicular or substantially perpendicular to the spring portions of the second fold.

In various embodiments, the periphery of the MEMS device includes vertical sides or sections and wherein the plurality of springs includes a first spring and a second spring that surround vertical sides or sections of the MEMS device.

In various embodiments, the springs and/or spring portions may be curved, arched, or straight, e.g., portions be spring portions having an arched, curved, or straight shape.

In various embodiments, springs are arranged in straight or substantially straight-line spring portions. The springs having straight or substantially straight spring portions may be favorable or economical in terms of taking up area or space.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A sensor device, comprising:
   an electronic device, comprising:
   a semiconductor substrate comprising at least one integrated circuit and a MEMS sensor, the MEMS sensor including a membrane,
   a back cavity within the semiconductor substrate arranged below the MEMS sensor and extending to a back side of the semiconductor substrate, and
   a suspension structure suspending at least the membrane of the MEMS sensor in the semiconductor substrate;
   a molding partially encapsulating the semiconductor substrate; and
   a sensor port comprising an opening in the molding at a front side of the substrate exposing at least the MEMS sensor membrane to an environment outside the sensor device,
   wherein the at least one integrated circuit comprises an application specific integrated circuit (ASIC).

2. The sensor device of claim 1, wherein the suspension structure comprises a spring structure formed within the semiconductor substrate.

3. The sensor device of claim 2, wherein the spring structure comprises springs formed from the substrate between one or more trenches of the semiconductor substrate.

4. The sensor device of claim 3, wherein the one or more trenches extend from the front side of the semiconductor substrate to the back cavity.

5. The sensor device of claim 1, wherein the suspension structure at least partially surrounds a perimeter of the membrane of the MEMS sensor.

6. The sensor device of claim 1, wherein the electronic device is mounted on a carrier.

7. The sensor device of claim 6, wherein the electronic device is attached to the carrier by an adhesive.

8. The sensor device of claim 6, wherein the at least one integrated circuit is electrically coupled to the carrier.

9. The sensor device of claim 8, wherein the at least one integrated circuit is electrically coupled to the carrier via a bond wire encapsulated within the molding.

10. The sensor device of claim 1, wherein the suspension structure electrically connects the MEMS sensor to the at least one integrated circuit.

11. The sensor device of claim 1, wherein the MEMS sensor is a pressure sensor.

12. A method for manufacturing a sensor device, comprising:
   providing a semiconductor substrate comprising at least on integrated circuit and a MEMS sensor each monolithically formed at a first side of the semiconductor substrate;
   forming a back cavity within the semiconductor substrate below the MEMS sensor and extending to a back side of the semiconductor substrate,
   forming a suspension structure from the semiconductor substrate, wherein the suspension structure suspends at least a membrane of the MEMS sensor in the semiconductor substrate; and
   forming a sensor port by at least partially encapsulating the substrate with a mold, the sensor port providing an opening in the mold to the first side of the substrate and exposing at least the MEMS sensor membrane to an environment outside the sensor device,
   wherein the at least one integrated circuit comprises an application specific integrated circuit (ASIC).

13. The method of claim 12,
   wherein forming the suspension structure comprises forming one or more springs in the substrate to suspend at the membrane of the MEMS sensor in the semiconductor substrate.

14. The method of claim 13,
   wherein the one or more springs are formed between one or more trenches through a trench etch process, the one or more trenches extending from the front side of the semiconductor substrate to the back cavity.

15. The method of claim 12,
   wherein forming a sensor port by at least partially encapsulating the substrate with a mold comprises a film assisted molding process.

16. The method of claim 12, further comprising,
   attaching the back side of the semiconductor substrate to a carrier, comprising adhering the back side of the semiconductor substrate to the carrier by an adhesive.

17. The method of claim 12, further comprising:
   attaching the back side of the semiconductor substrate to a carrier after the back cavity has been formed.

* * * * *